United States Patent [19]
Friedrich

[11] Patent Number: 5,241,272
[45] Date of Patent: Aug. 31, 1993

[54] CIRCULARLY POLARIZING LOCAL ANTENNA FOR A NUCLEAR MAGNETIC RESONANCE IMAGING APPARATUS

[75] Inventor: Axel Friedrich, Erlangen, Fed. Rep. of Germany

[73] Assignee: Siemens Aktiengesellschaft, Munich, Fed. Rep. of Germany

[21] Appl. No.: 933,735

[22] Filed: Aug. 24, 1992

[30] Foreign Application Priority Data

Aug. 27, 1991 [DE] Fed. Rep. of Germany ....... 4128323

[51] Int. Cl.$^5$ .............................................. G01V 3/00
[52] U.S. Cl. .................................. 324/318; 324/322; 128/653.5
[58] Field of Search ............... 324/307, 311, 313, 314, 324/318, 322; 128/653.5

[56] References Cited

U.S. PATENT DOCUMENTS

| | | | |
|---|---|---|---|
| 4,506,224 | 3/1985 | Krause | 324/319 |
| 4,594,566 | 6/1986 | Maudsley | 324/318 |
| 4,766,383 | 8/1988 | Fox et al. | 324/318 |
| 4,767,933 | 8/1988 | Hanawa | 324/318 |
| 4,816,765 | 3/1989 | Boskamp | 324/318 |
| 4,879,516 | 11/1989 | Mehdizadeh et al. | 324/318 |
| 5,006,805 | 4/1991 | Ingwersen | 324/322 |
| 5,144,239 | 9/1992 | Oppelt et al. | 324/318 |

FOREIGN PATENT DOCUMENTS 0412824 2/1991 European Pat. Off. .

Primary Examiner—Louis Arana
Attorney, Agent, or Firm—Hill, Steadman & Simpson

[57] ABSTRACT

A local antenna system for generating and receiving circularly-polarized, high-frequency magnetic fields in a nuclear magnetic resonance imaging apparatus has two coil groups disposed to define an examination volume therebetween, with each coil group having two coils therein, with each coil having a middle axis disposed at an angle substantially less than 90° relative to the middle axis of the other coil in that group. The coil groups are disposed relative to the examination volume so that each coil in a coil group has a diagonally disposed counterpart coil in the other coil group. When the diagonally coils are respectively fed with currents which are phase-shifted by 90° relative to each other, they respectively generate circularly-polarized high-frequency magnetic fields in the examination volume which are in-phase. In a reception mode, the signals induced in the diagonally disposed coils are superimposed in-phase.

6 Claims, 2 Drawing Sheets

CIRCULARLY POLARIZING LOCAL ANTENNA FOR A NUCLEAR MAGNETIC RESONANCE IMAGING APPARATUS

BACKGROUND OF THE INVENTION

1. Field of the Invention

The present invention relates to a local antenna for the generation and/or for the reception of a circular magnetic high-frequency field in a nuclear magnetic resonance imaging apparatus with two oppositely disposed coil groups formed by two coils, the central coil axes of which are arranged at an angle to one another, in which for the generation of the circular magnetic high-frequency field the magnetic fields generated by the coils of a coil group are phase-shifted relative to each other by 90° and in which for the reception of the circular magnetic high-frequency field the signals induced in the coil group, after a 90° phase shift relative to each other, are superimposed.

2. Description of the Prior Art

In nuclear magnetic resonance imaging apparatuses, either linearly or circularly polarized magnetic high-frequency fields are used for the excitation of the nuclei. A linear field may be thought of as composed to two fields of equal magnitude respectively circularly polarized in opposite directions. This means that in a linearly polarizing antenna theoretically twice as much power is needed to achieve the same excitation as in a circularly polarizing antenna. Regulations for the protection of the patient permit only a maximal transmitting power. This restricts the possible sequences, especially the number of scanned anatomical layers in a given examination time. For this reason, with circularly polarized antennas theoretically twice as many (in practice not entirely twice as many) layers can be scanned in the same time as with a linearly polarizing antenna. The received signals then, after a 90° phase shift of one signal, can be added in-phase. Thereby the useful signal is doubled, while the effective value of the noise is increased by the factor of 2. A circularly polarizing reception antenna thus has, with respect to a linearly polarizing reception antenna, a theoretical signal-to-noise gain of 2. The signal-to noise gain in practice, however, does not quite reach the theoretical value. Thus, both in transmission and in the reception, circularly polarizing antennas have advantages.

A so-called whole-body antenna or a body resonator designed for the generation and for the reception of a circularly polarized high-frequency field is disclosed in DE-OS 31 33 432. Two oppositely directed coil groups are arranged on an imaginary cylindrical surface, in which the central coil axes of the coils in a coil group are perpendicular to one another.

For the generation of a circular magnetic high-frequency field the coils of a coil group are fed with high-frequency currents phase-shifted relative to each other by 90°. A patient to be examined is placed, for the production of tomograms, in the longitudinal direction within the cylindrical coil arrangement, so that the individual coils are located above and below as well as on both sides of the patient.

Similar to the above-described whole-body antenna, a local antenna for the examination of the head is known, with which circular magnetic high-frequency fields can also be generated. In contrast to the whole-body antenna, the head antenna can be opened in the lengthwise direction of the cylinder. After placement of the head on a lower part of the antenna, for the examination an upper part of the antenna is placed over the head and the head antenna is closed. Thus, with this antenna arrangement the body part to be examined is also completely enclosed by the antenna.

If section images of the upper body, and especially of the heart region, are recorded, with a conventional whole-body antenna, the whole-body antenna, because of its large reception surface, also receives noise signals from the other body parts. The signal-to-noise ratio is therewith worsened in such examinations. For this reason, for examinations of the upper part of the body, linearly polarized antennas are also used, although their effective field constituent is less than that of circularly polarized antennas.

SUMMARY OF THE INVENTION

It is an object of the present invention in a nuclear magnetic resonance imaging apparatus, to improve the imaging of partial zones or regions of a body to be examined and to increase the patient comfort in the examination of such partial zones or regions.

The above object is achieved in accordance with the principles of the present invention in an antenna system of the type described above having two coil groups each consisting of two coils wherein the middle coil axes of the coils in the coil groups form an angle that is substantially smaller than 90°, and wherein the respective coils in each group are electrically connected to a coil of the other coil group which is diagonally disposed relative thereto. The respective magnetic high-frequency fields generated in a transmission mode by the sets (of which there are two) diagonally-disposed coils are in phase, and in combination these respective fields form a circularly polarized field in an examination region. In a reception mode the signals induced in the diagonally-disposed coils by the circularly polarized high frequency field are superimposed in-phase.

As used herein, "middle coil axis" means a coil axis determined by an average value formation, which in a symmetrical coil is the same as the axis of symmetry. Through the deviation from the otherwise ideal 90° arrangement of the coils to one another, the dimensions of the antenna can now be adapted well to the size of the body part. The body parts are no longer enclosed on all sides of the local antenna. The antenna, therefore, receives no noise components from body parts that are not to be examined. An antenna that does not completely enclose the patient can be more easily handled. Furthermore, the patient, because the inventive antenna system does not completely enclose the patient, does not feel so severely locked in. The inventive antenna system, accordingly achieves ergonomic advances a higher patient comfort. Simultaneously the signal-to-noise ratio and therewith the image quality are improved and the required transmitting power is reduced.

In one embodiment of the invention, the coil groups are respectively arranged in substantially parallel surfaces, so that the coil axes of the coils in a group are aligned essentially parallel. This coil arrangement is especially suited for recording section images of the trunk region.

In a further variation, the coils partially overlap in the coil groups. The overlapping is adjusted such that the counter-inductance produced by the coils in each virtually vanishes. With this measure the reciprocal influencing of the coils on each other is kept low.

In a further embodiment, the coils are connected in a cylindrical coil arrangement, the coil axes being substantially perpendicular to one another. With such a coil arrangement there can be generated section images of the neck-and-upper body zone because it is adapted to the anatomy of this region of the body.

DESCRIPTION OF THE PREFERRED EMBODIMENTS

Figure 1:
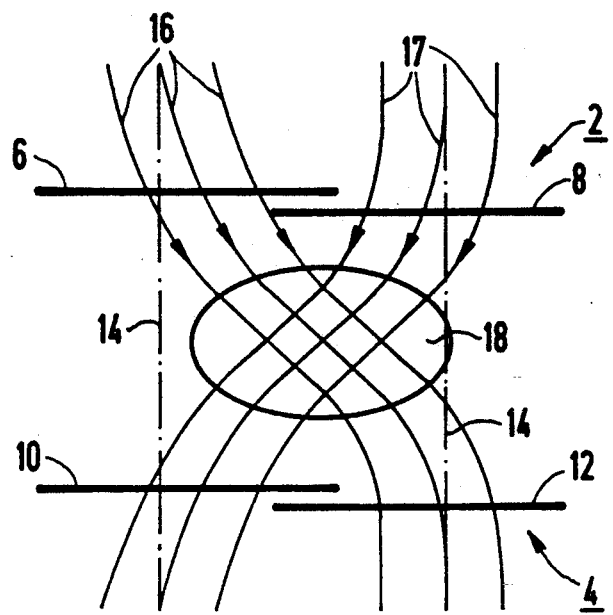
FIG. 1 shows a side view of a local antenna constructed in accordance with principles of the present invention in a first embodiment, in which coil groups are arranged in parallel oppositely-lying planes.
Figure 2:
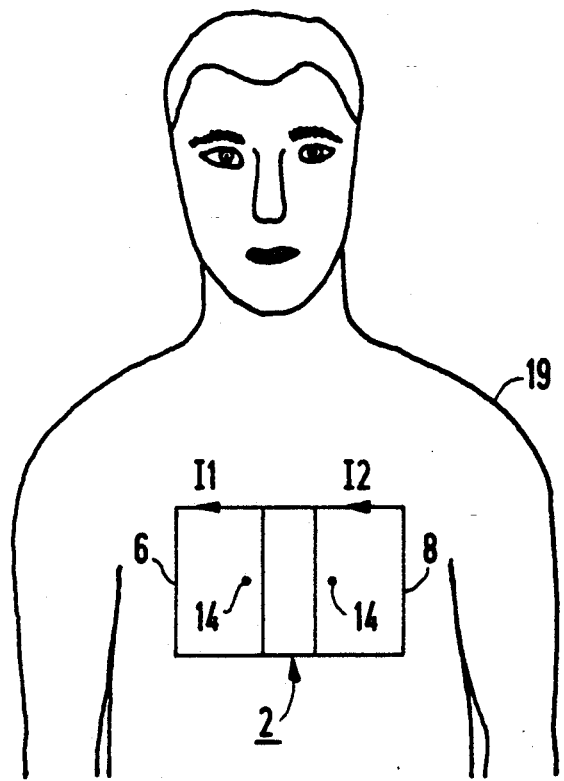
FIG. 2 is a plan view of the flat coil arrangement according to FIG. 1, shown in the context of application to a subject.

FIG. 1 shows a side view of a local antenna with two oppositely arranged coil groups 2 and 4. The coil group 2 consists of two coils 6 and 8, which lie in a first plane. The coil group 4 lying in a second plane consists of two coils 10 and 12. The coils 6, 8 and 10, 12 h ave a rectangular shape as shown in FIG. 2. For each coil 6, 8, 10 and 12 there can be defined a middle coil axis or axis of symmetry 14, which in the case of the flat coils 6, 8, 10 and 12 is perpendicular to the respective coil planes and runs through the center of each coil. In the local antenna of FIG. 1, which is especially suited for examinations of the trunk, the coil axes 14 lie parallel to one another. The local antenna, therefore, can be brought close to the examination zone. Within the coil groups the coils 6 and 8 as well as 10 and 12 overlap on one side of the rectangle in order to keep the counter-inductance between the coils 6 and 8 and between 10 and 12 low. A patient is placed between the two coil groups 2 and 4.

If a high-frequency current $l_1$ or separate, in-phase currents flows through each of the coils 6 and 12, in the same direction, a magnetic high-frequency field is generated having field lines 16 which run in the arrangement approximately diagonally from the coil 6 to the coil 12. Analogously, a second field is generated if a current $l_2$ or separate, in-phase currents flows through the coils 8 and 10. Its field lines 17 then run from the coil 8 to the coil 10. Within a zone 18 the field lines 16 and 17 generated by the coils 6, 12 and 8, 10 are approximately perpendicular to one another. Within the zone 18, a circular magnetic high-frequency field is generated if the currents $l_1$ and $l_2$ exhibit a phase shift of 90° relative to one another. The examination zone of which section images are to be generated must be brought within the zone 18. In the reception mode, each coil set of diagonally disposed coils generates a signal. In the reception mode, one of the received signals is phase-shifted by 90° and the signals are then added in-phase.

FIG. 2 shows a plan view of the local antenna the coil group 2. A contour of the patient 19 is likewise shown in the drawing. The other coil group is not shown, but is disposed beneath the patient 19 in registry with the coil group 2. FIG. 2 shows the local antenna in an application as angiography antenna for the examination of the heart region. The coils 6, 8, 10 and 12 have a square cross section with an edge length of about 20 cm. Significantly, smaller dimensions can also still have good reception properties. The cross section of the local antenna is restricted to the examination zone. Thus, noise components, for example, of the upper arms which are likewise covered by a whole-body antenna, are not received by the local coil. Nevertheless the advantages of the circularly polarized magnetic high-frequency field can be utilized. The coil axes 14 are represented in the plan view as points; they lie in the center of the flat coils 6, 8, 10, 12. The coils 6 and 8 and the coils 10 and 12 overlap with one edge.

Figure 3:
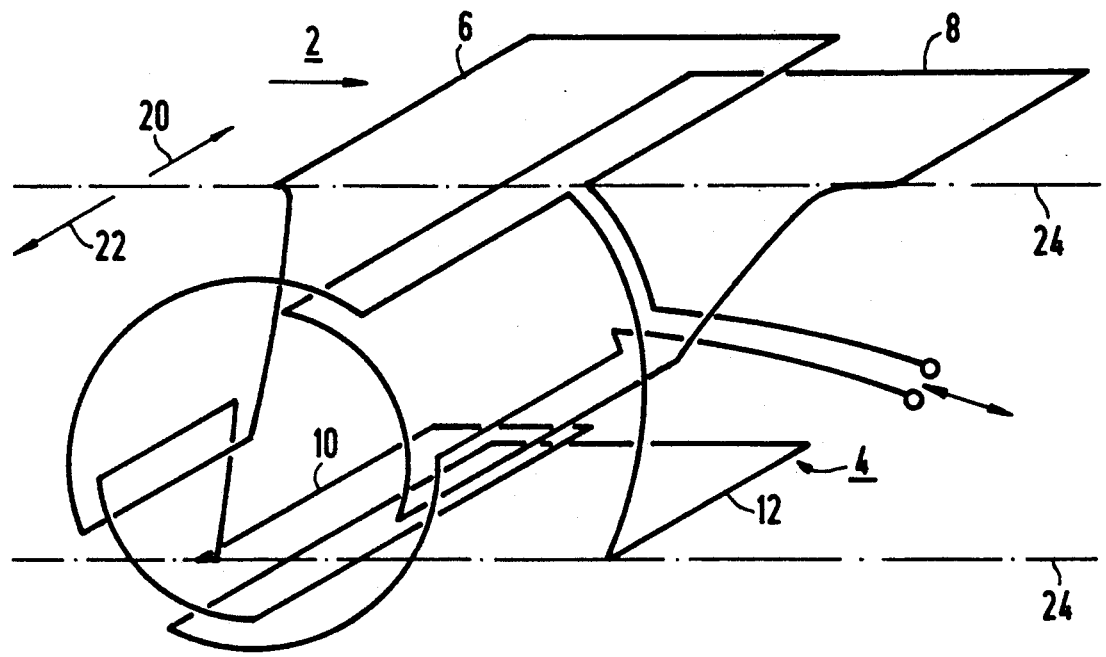
FIG. 3 is a local antenna constructed in accordance with the principles of the present invention in which the flat coils are connected in a cylindrical coil arrangement.
Figure 4:
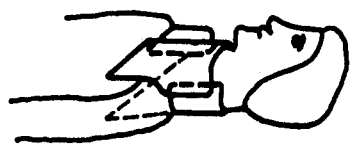
FIG. 4 shows the application of the local antenna according to FIG. 3 in the context of application to a subject.

FIG. 3 shows a local antenna which presents a first zone (indicated by arrow 20) with coil groups 2, 4 which are arranged in parallel planes opposite one anotherand, a second zone (indicated by arrow 22) with a cylindrical coil arrangement, the coil axes of which are perpendicular. The flat coil groups and the cylindrical coil arrangement are joined in a plane that is indicated by the dot-and-dashed lines 24. The coil axes of the zone 20 are disposed at an angle of 45° with respect to the coil axes of the zone 22. Thus, the circular fields of both zones 20 and 22 are aligned in the examination zone. A common feed or a single tap for the diagonally disposed flat coils and the associated coils of the cylindrical coil arrangement 22 is represented in FIG. 3 for the coils 12 and the associated cylindrical coils. A flat coil can be alternatively connected, however, with only one associated cylindrical coil, as is represented for the flat coils 8 and 10. These coil combinations can then be separately fed or tapped. Such a coil arrangement is suited especially for the generating of section images in the upper body and neck zone, the use of which is schematically represented in FIG. 4.

Although modifications and changes may be suggested by those skilled in the art, it is the intention of the inventor to embody within the patient warranted hereon all changes and modifications as reasonably and properly come within the scope of his contribution to the art.

I claim as my invention:

1. A local antenna system for the generation and reception of circularlypolarized, high-frequency magnetic fields in a nuclear magnetic resonance imaging apparatus, said antenna system comprising:

first and second coil groups disposed spaced from each other and defining an examination volume therebetween;

each coil group consisting of two coils, each coil having a middle axis and the respective middle axes of the two coils in each coil group being disposed at an angle relative to each other which is substantially less than 90°;

said coil groups being disposed relative to said examination volume so that each coil in a coil group has a diagonally disposed counterpart coil in the other coil group, thereby forming two sets of diagonally disposed coils; and said sets of diagonally disposed coils in combination forming means, in a transmission mode when the diagonally disposed coils in a set are fed with in-phase currents and the respective currents fed to each set are phase-shifted by 90° relative to each other, for generating a circularlypolarized high-frequency magnetic field in said examination volume, and in a reception mode, for receiving signals superimposed in-phase induced in said diagonally disposed coils by a circularly polarized field in said examination volume.

2. A local antenna system according to claim 1 wherein said coil groups are respectively disposed in substantially parallel planes on opposite sides of said examination volume so that said middle axes of the coils in each group are substantially parallel.

3. A local antenna system according to claim 1 wherein the coils in each coil group partially overlap.

4. A local antenna system according to claim 1 wherein each of said coils has a rectangular shape.

5. A local antenna system according to claim 1 further comprising a cylindrical coil arrangement connected to said coils in said coil groups, said cylindrical coil arrangement having a coil axis disposed substantially perpendicular to the middle coil axes of said coils in said coil groups.

6. A local antenna system according to claim 1 having a shape conforming to the upper part of the human body and neck for use as an angiography antenna.

* * * * *